(12) United States Patent
Antoni et al.

(10) Patent No.: US 7,871,171 B2
(45) Date of Patent: Jan. 18, 2011

(54) FOCUSING-DEVICE FOR THE RADIATION FROM A LIGHT SOURCE

(75) Inventors: Martin Antoni, Aalen (DE); Frank Melzer, Utzmemmingen (DE); Andreas Seifert, Aalen (DE); Wolfgang Singer, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 358 days.

(21) Appl. No.: 12/218,400

(22) Filed: Jul. 15, 2008

(65) Prior Publication Data

US 2008/0297755 A1    Dec. 4, 2008

Related U.S. Application Data

(63) Continuation of application No. 10/675,471, filed on Sep. 30, 2003, now Pat. No. 7,410,265, which is a continuation of application No. 09/950,186, filed on Sep. 10, 2001, now Pat. No. 6,655,808.

(30) Foreign Application Priority Data

Sep. 13, 2000  (DE)  ................. 100 45 265

(51) Int. Cl.
*G02B 5/08* (2006.01)
(52) U.S. Cl. ...................................... 359/846
(58) Field of Classification Search ................. 359/845, 359/846, 850, 869, 631, 727; 126/602, 605
See application file for complete search history.

(56) References Cited

U.S. PATENT DOCUMENTS 1,865,441 A    7/1932    Mutscheller 3,806,209 A    4/1974    Laing et al.
4,333,446 A  *  6/1982    Smyth .................. 359/853

(Continued)

FOREIGN PATENT DOCUMENTS

DE    1 01 38 284    2/2003

(Continued)

OTHER PUBLICATIONS

"EUV collectors: design, development, fabrication and testing"; XP-002348559, pp. 39-49; Authors: Wilhelm Egle, Wolfgang Hafner, Axel Matthes, Eral Erzin, Behrard, Ganswein, Herbert Schwarz, Piotr Marczuk Martin Antoni, Wolfgang Singer, Frank Melzer, Joachim Hainz, Calrl Zeiss Laser Optics, GmbH, 73445 Oberkochen, Germany, Carl Zeiss SMT-AG, 73447 Oberkochen, Germany.

(Continued)

*Primary Examiner*—Euncha P Cherry
(74) *Attorney, Agent, or Firm*—Fish & Richardson P.C.

(57)  ABSTRACT

A focusing-device for the radiation from a light source (2) is provided with a collector mirror (1, 1') which is arranged in a mount (24) and collects the light, in virtual or real terms, from the light source (2) at the second focus (200). The collector mirror (1, 1') is displaceably connected to the mount (24) via a bearing in such a way that its optical properties remain at least approximately the same even in the event of temperature changes.

67 Claims, 9 Drawing Sheets

U.S. PATENT DOCUMENTS

| | | |
|---|---|---|
| 4,664,488 A | 5/1987 | Sawicki et al. |
| 5,142,132 A | 8/1992 | MacDonald et al. |
| 5,594,831 A | 1/1997 | Oparin et al. |
| 5,798,823 A | 8/1998 | Kudo |
| 6,381,387 B1 | 4/2002 | Wendland, Jr. |
| 6,655,808 B2 | 12/2003 | Antoni et al. |

FOREIGN PATENT DOCUMENTS

| | | |
|---|---|---|
| EP | 0744641 | 11/1996 |
| EP | 1 189 089 | 3/2002 |
| JP | 520 29748 | 3/1977 |
| JP | 010 74502 | 3/1989 |
| JP | 081 01299 | 4/1996 |
| JP | 091 78922 | 7/1997 |

OTHER PUBLICATIONS

EPO Search Report based on EP 1 189 089.

* cited by examiner

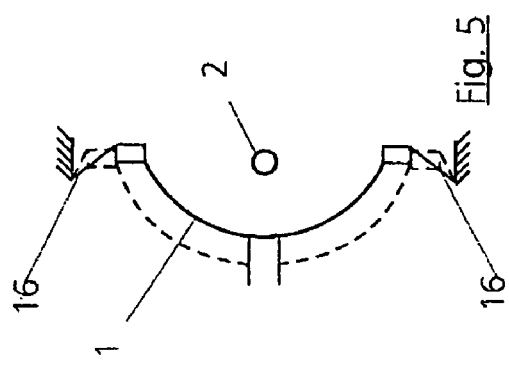
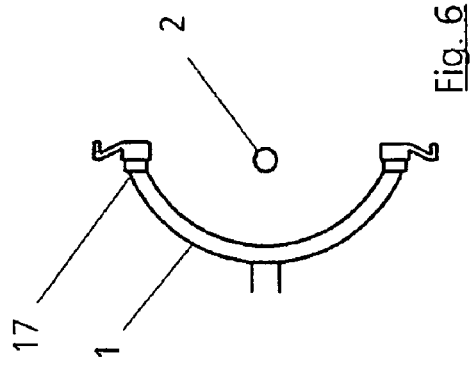
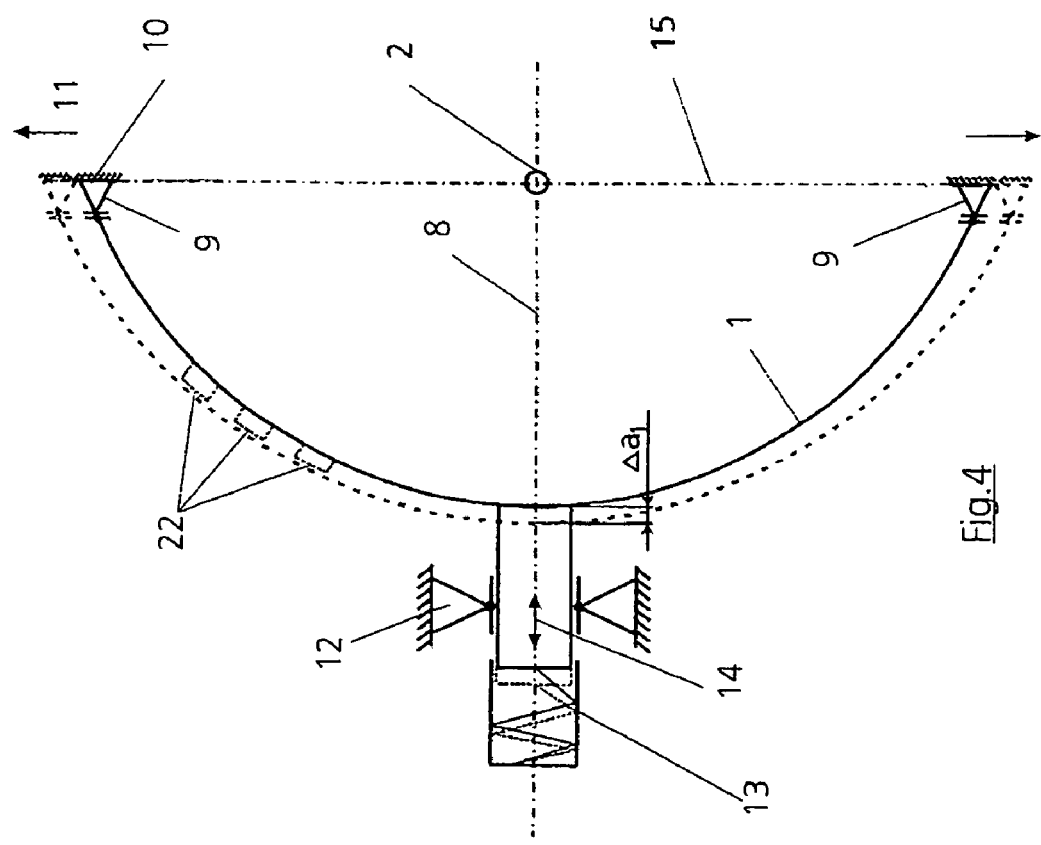

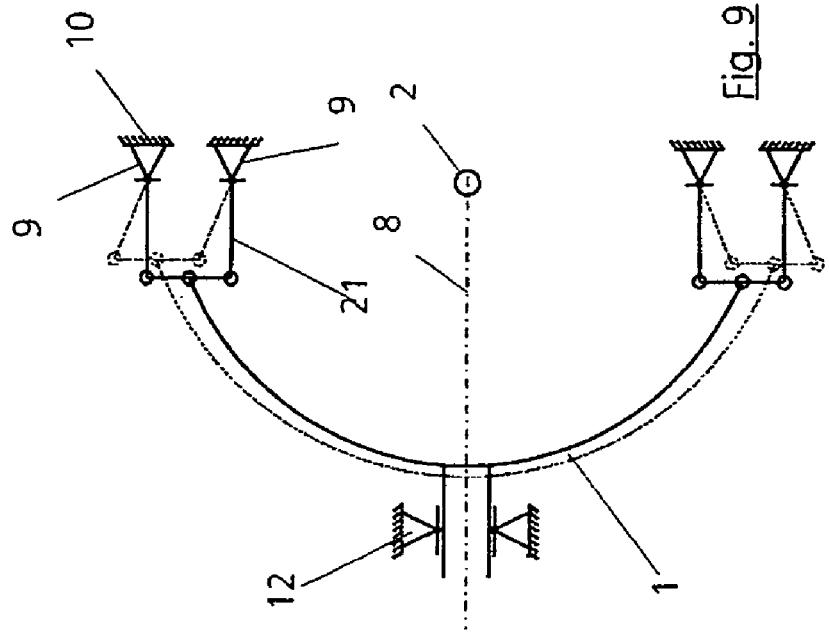
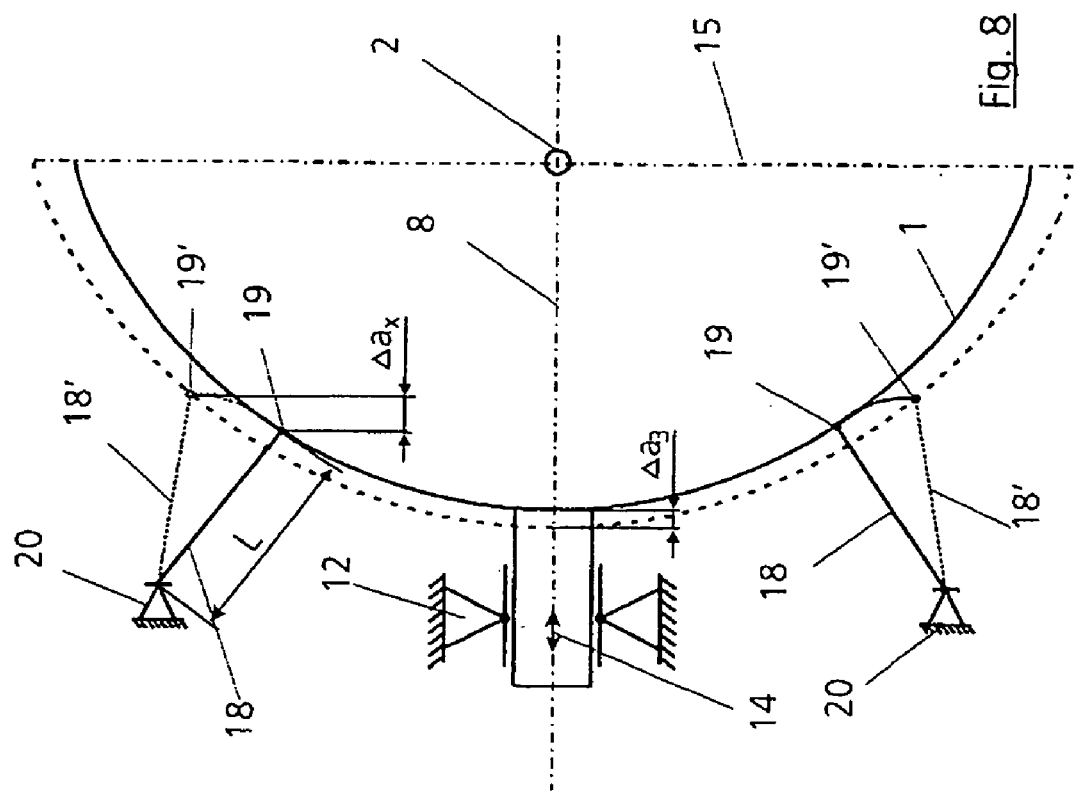
Fig. 8
Fig. 9

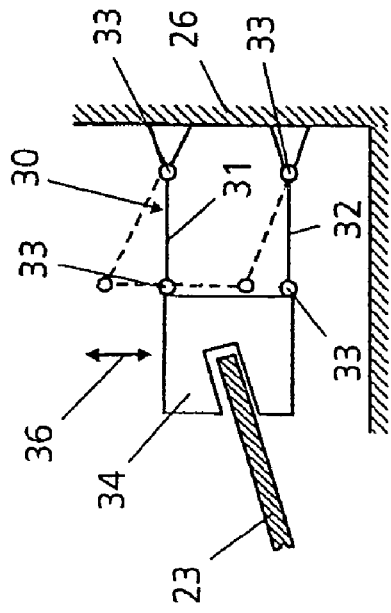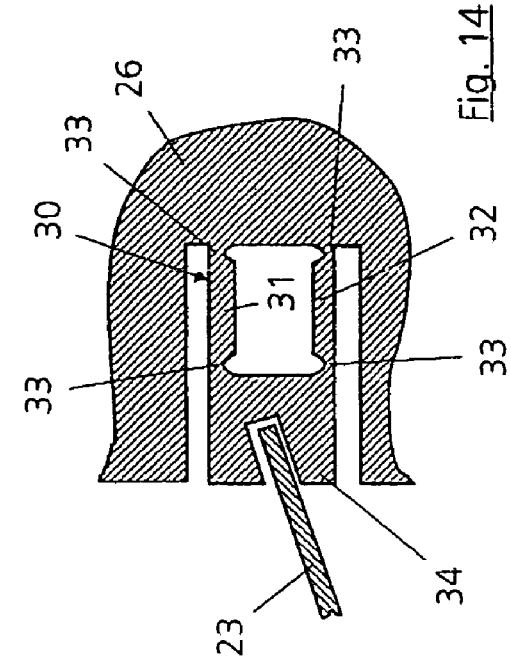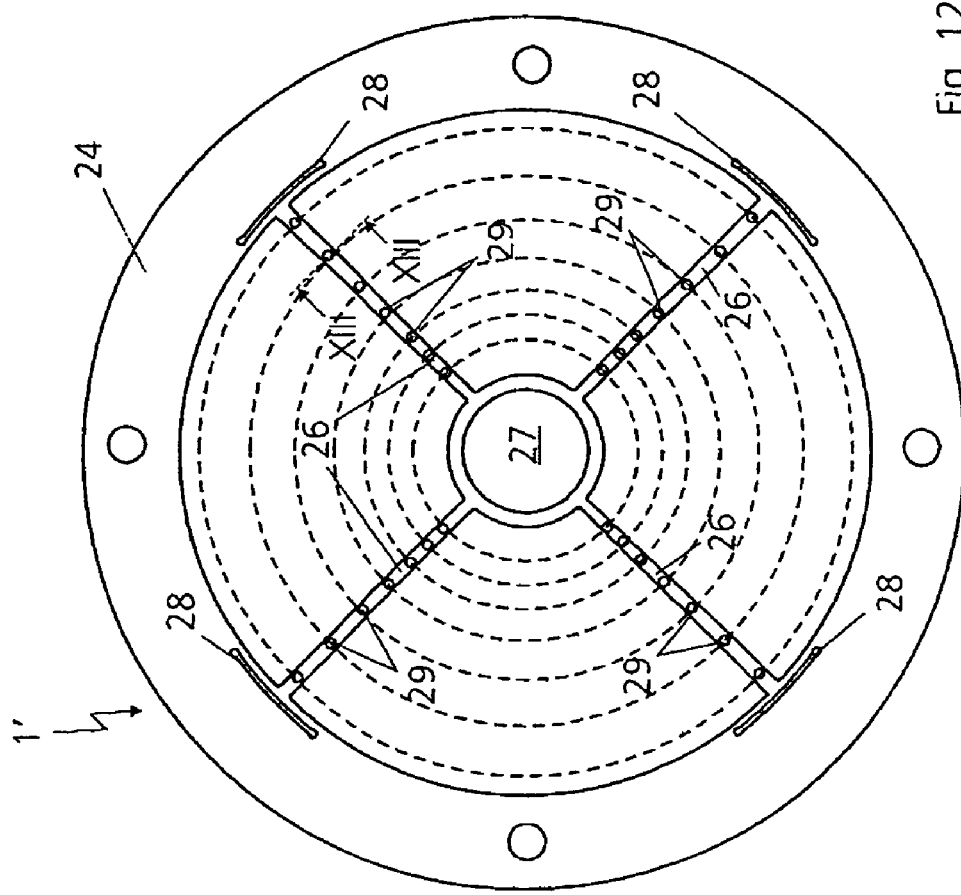

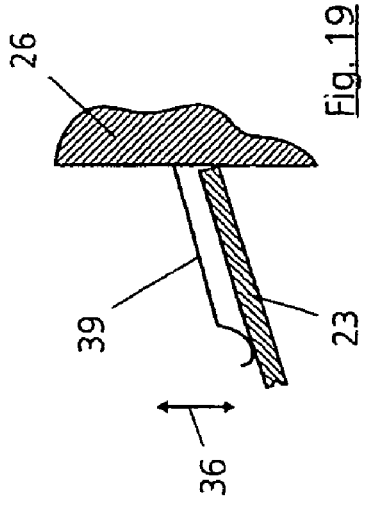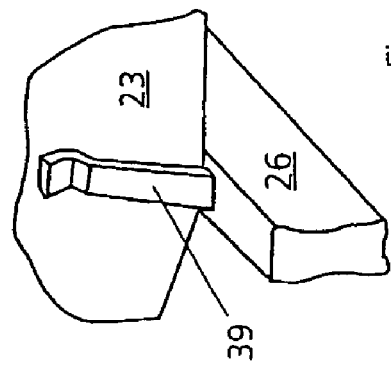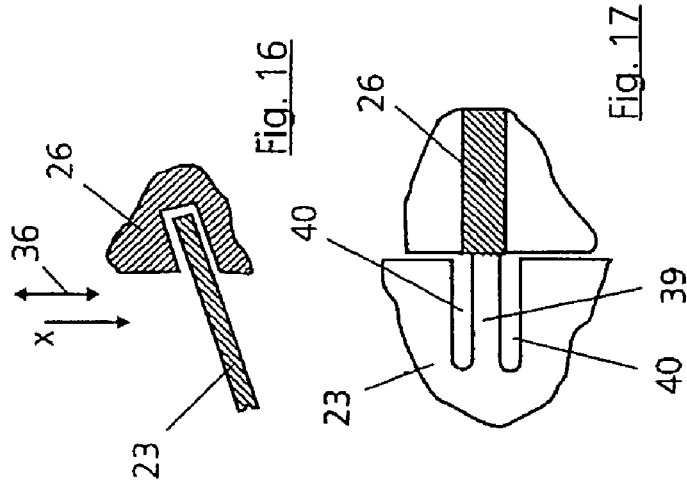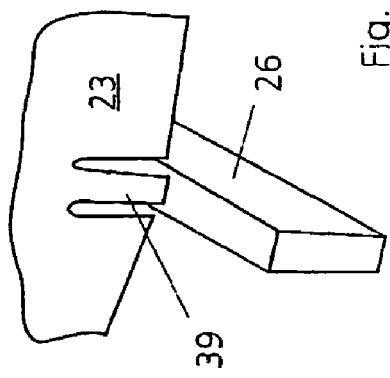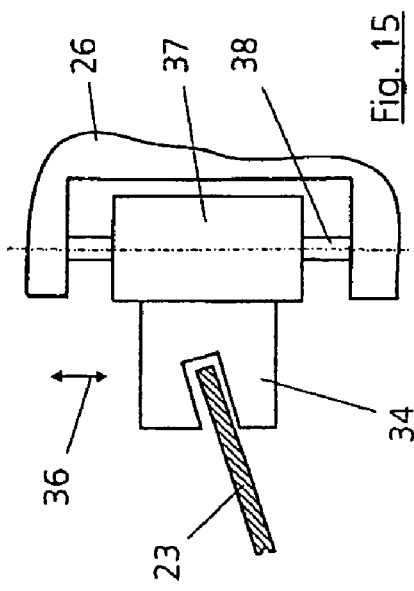

FOCUSING-DEVICE FOR THE RADIATION FROM A LIGHT SOURCE

BACKGROUND OF THE INVENTION

1. Field of the Invention

The invention relates to a focusing-device for the radiation from a light source, in particular a laser plasma source, having a collector mirror according to the preamble of claim 1 of a type defined more closely.

An illuminating system having a collector mirror is described in U.S. Pat. No. 5,798,823.

2. Description of the Related Art

In semiconductor lithography, use is frequently made of a light source, for example a laser plasma source, whose light is collected, in virtual or real terms, via a collector mirror at a second focus, and then guided for beam formation into an illuminating system. The collector mirror is heated by the laser plasma source, resulting in corresponding changes in shape which have negative effects on the downstream illuminating system such as, for example, illumination defects, for example telecentring errors, uniformity defects, and this can lead to light losses.

It is known for the purpose of avoiding these disadvantages to cool the collector mirror in order to dissipate the heat produced. Irrespective of the large outlay required for this purpose, because of unavoidable tolerances problems continue to exist, nevertheless, with reference to the imaging accuracy, and these are to be ascribed, inter alia, to a change in position of the second focus. In addition, given high thermal loads, which can vary strongly with time in the case of pulsed operation, the collector mirror cannot be kept entirely at a constant temperature level, and so would necessitate a "dynamic" cooling system.

SUMMARY OF THE INVENTION

It is the object of the present invention to create a device in the case of which the disadvantages of the prior art are avoided, in particular in the case of which the optical properties of a collector mirror are maintained in an unchanged form even under thermal loading such that no negative effects on the downstream illuminating system occur.

According to the invention, this object is achieved by means of the features claimed in the characterizing part of claim 1.

By virtue of the fact that the collector mirror is specifically displaced in the z-direction, that is to say in the direction of the optical axis, and that the collector mirror itself is designed in such a way that the position of the second focus remains unchanged in the event of temperature change, the optical properties of the collector mirror are maintained in an unchanged form even under thermal loading.

It is proposed according to the invention in a first design solution to mount or configure the collector mirror such that its shape is formed in accordance with an isofocal family of curves, for example a family of ellipses, a family of hyperbolas or a family of parabolas. What is meant by an "isofocal" family of curves is that the spacing from the source, that is to say from the first focus to the second focus, does not change. Only a family of ellipses will be spoken of below, for the sake of simplification. An isofocal family of ellipses projects a source into a fixed image of the source. If the collector mirror is now shaped under heating in accordance with the isofocal family of ellipses, its optical properties remain constant. This means that it is then no longer necessary to cool the collector mirror, or to keep it at a constant temperature, by means of a high outlay, but that heating is permitted while ensuring, however, that the change in shape of the collector mirror resulting therefrom takes place such that selected optical properties remain unchanged.

For such an isofocal collector mirror, the conic constant K and the semiparameter p=R can be represented to a good approximation by linear functions of the intercept distance between the source and the vertex of the collector mirror.

If, on the other hand, the aim is to avoid a change in magnification, normally negligible per se, owing to a change in or displacement of the collector mirror, the spacing from the source to the imaging plane of the light source must be varied as second solution. This can be performed, for example, actively or else via a passive thermal expansion. The eccentricity γ or conic constant K must remain constant for such a collector mirror which contains magnification, and the vertex curvature p=R must change linearly. This solution is advantageous in some circumstances for a system with critical illumination, because then the image of the light source remains the same size on the reticule.

By contrast with the solution using the isofocal family of curves, where the spacing between the first and the second focus remains the same, in this alternative solution the beam angle from the collector mirror to the second focus remains the same, the second focus thereby being displaced correspondingly. If the second focus is to remain at the same point, it follows that not only the collector mirror must be moved correspondingly in the z-direction, but also the source or the first focus.

Since collector mirrors are generally subjected to an anisotropic thermal loading, it may be provided in a refinement according to the invention that the collector mirror is provided with inhomogenously distributed cooling devices in such a way that an at least approximately uniform temperature distribution is achieved in the collector mirror. Although this does entail a higher outlay, by comparison with known cooling devices, however, this outlay can be kept markedly lower, because there is no need to carry out an entire cooling of the collector mirror, but only to ensure a largely uniform temperature distribution.

Instead of a collector mirror which operates by reflection, it is possible in a very advantageous refinement of the invention also to support in the inventive way a collector mirror which, as a so-called transmitted-light collector, has a plurality of nested annular shells or mirror shells which are jointly fastened on a mount. Such transmitted-light collectors, also termed shell collectors, are also denoted as "nested collectors" (see, for example, EP 1 225 481 A2 and DE 101 38 284 A1). In use, a shell collector exhibits strong heating, and this results in deformation of the collector mirror owing to temperature gradients and/or different coefficients of thermal expansion of the components used. This applies, in particular, in the bearing regions of the annular shells to the mount which is generally designed as a mounting ring or spoked ring having a plurality of spokes which run in a radial direction and on which the individual annular shells are fastened at an appropriate radial spacing from one another.

The imaging of the source at the secondary focus is effected by the geometry of the mirror shells. Any change in this geometry leads to a change in the image. During operation and as a result of the operating conditions (EUV radiation and vacuum) the collector is strongly heated and can reach a temperature of several hundred degrees Celsius. The selection of the material lends the annular cells a specific coefficient of thermal expansion (CTE), and likewise the mounting ring. Deformations come about at the collector since there is a temperature gradient across the annular shells and the mounting ring and thus as a result of: $\Delta L = L*CTE*\Delta T$ (L=length, $\Delta L$=change in length, T=temperature and $\Delta T$=temperature deviation) differently observed points on the mounting ring and the annular shells expand differently. These deformations are extremely large, particularly at the joints between the annular shells and mounting ring since the largest temperature gradients in the system occur here, depending on the joining method. This means that because, for example, of a higher temperature level the collector would like to expand more at the clamping point than the mounting ring. Since the mounting ring has the higher degree of stiffness, the expansion of the annular shells at this point is suppressed. However, the shells can expand without hindrance at the non-clamped points. As a result of this, given clamping points with a distribution of 4×90°, for example, the collector is formed like a clover leaf, since the mounting ring suppresses expansion at the four clamping points, whereas expansion is possible at four points offset by 45°. The above-described asymmetrical deformation of the collector cannot be corrected or can be corrected only with a large outlay.

According to the invention, the connecting points or clamping points of the annular shells on the mounting ring or the ribs can be selected such that the annular shells can expand symmetrically with reference to the optical axis. The mirror collector leads in this way to a symmetrical change in shape by comparison with the cold state. This symmetrical change in shape, and the changes, possibly associated therewith, in the optical imaging of the system can then, if required, be compensated without major problems. If the annular shells of the mirror collector are supported on one side or in a floating fashion in the mounting ring, for example at one end, and if thereby the other end is not clamped in, the free end can expand correspondingly in the direction of the optical axis. All that is then required at the clamping points is to permit movements and/or displacements of the annular shells in the radial direction or perpendicular to the optical axis. The annular shells can be connected to the mounting ring on the side diverted from the light source, or be connected to the mounting ring at any desired site between the two ends.

Both passive and active systems, and also combinations of the two, can be used to enable displacement of the annular shells in a radial direction. In the case of passive systems, it must be ensured that the stiffness at the clamping point is not too greatly reduced. Active systems offer the possiblility of a higher degree of stiffness at the clamping point, but it is then necessary to provide separate adjusting elements which are to be actuated from outside.

Parallelogram guides for the annular shells or for bearing parts in which the annular shells are held are, for example, possible as passive or else active systems. Likewise possible are pulling wires or push rods in the strengthening ribs, which pull or push the bearing parts appropriately into a desired position. Linear guides with slide or ball bearings in the form of telescopic changes in length are also conceivable.

A further possible connection of the annular shells to the mounting ring or the strengthening ribs consists in making use for this purpose of leaf springs which are either formed integrally in the circumference of the annular shells or are arranged as separate parts on the circumference of the annular shells. The leaf springs can in this case run both in the direction of the optical axis and in the circumferential direction of the annular shells.

Also conceivable as semi-active systems are actuators which react to temperature changes. In this case, the annular shells or their bearing parts are connected to the mounting ring via a "thermal actuator". The "thermal actuator" is designed in this case with reference to its length and its coefficient of thermal expansion in such a way that annular shells or their bearing parts are displaced in the event of temperature changes such that the optical properties of a collector mirror do not change or change only to a correctable extent.

BRIEF DESCRIPTION OF THE DRAWINGS

Design configurations for specifically carrying out the change in shape of the collector mirror in the desired way are explained schematically in principle in the subclaims and in the exemplary embodiments described below diagrammatically with the aid of the drawing, in which:

FIG. 4 shows a first type of bearing for the isofocal collector mirror according to the invention;

FIG. 5 shows a bearing of an isofocal collector mirror with a bending spring;

FIG. 6 shows a bearing of an isofocal collector mirror with active components;

FIG. 8 shows a bearing for an isofocal collector mirror with a reduced change in position in the event of temperature increase;

FIG. 9 shows a bearing of an isofocal collector mirror in a mount via a parallelogram guide;

FIG. 12 shows the top view of the mounting ring of the shell collector according to FIG. 10;

FIG. 13 shows a schematic illustration of a bearing of an annular shell on the mounting ring in a section along the line XIII-XIII according to FIG. 12;

FIG. 14 shows an embodiment of a bearing of an annular shell on the mounting ring in a similar configuration to FIG. 13;

FIG. 15 shows a third embodiment of a bearing of an annular shell in the mounting ring with a linear guide;

FIGS. 16 to 18 show a bearing of an annular shell in the mounting ring via a leaf spring which is integrally formed or incorporated into the annular shell;

FIGS. 19 and 20 show a bearing via a leaf spring, similar to the bearing according to FIGS. 16 to 18, the leaf spring being designed as a separate part;

DETAILED DESCRIPTION

Figure 1:
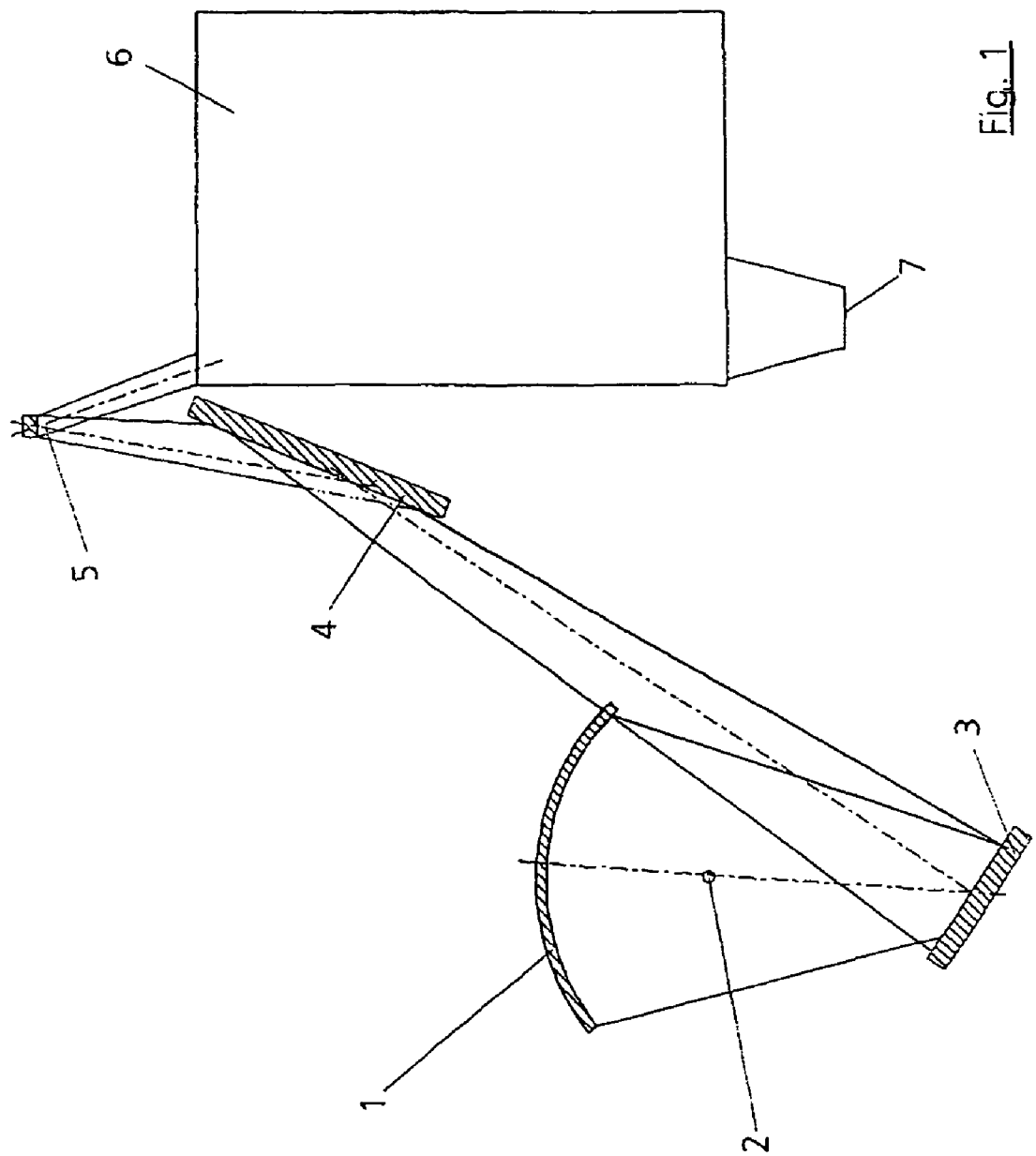
FIG. 1 shows a schematic illustration of a collector mirror according to the invention which is arranged in an EUV illuminating system for microlithography, in a first embodiment.

Illustrated in FIG. 1 as an example for a possibility of use is a collector mirror 1 which behaves isofocally and is integrated in an illuminating system for the purpose of fabricating semiconductor elements for EUV lithography.

The light from a source 2, for example a laser plasma source or a pinch plasma or dense plasma focus, is projected onto a facet mirror 3 via the collector mirror 1. The source 2 is situated at the first focus of the collector mirror 1. In the exemplary embodiment illustrated, the second focus 200 (not illustrated in FIG. 1) is situated downstream of the facet mirror 3. The light is fed from the facet mirror 3 to a reticle (mask) 5 via a deflecting mirror 4. The structure of the reticle 5 is led to a wafer 7 for projecting via a projection lens 6 (not shown in any more detail).

The laser plasma source 2 subjects the collector mirror 1 to a high thermal load which changes its shape. This change in shape would normally lead to uncontrolled illumination defects.

Figure 2:
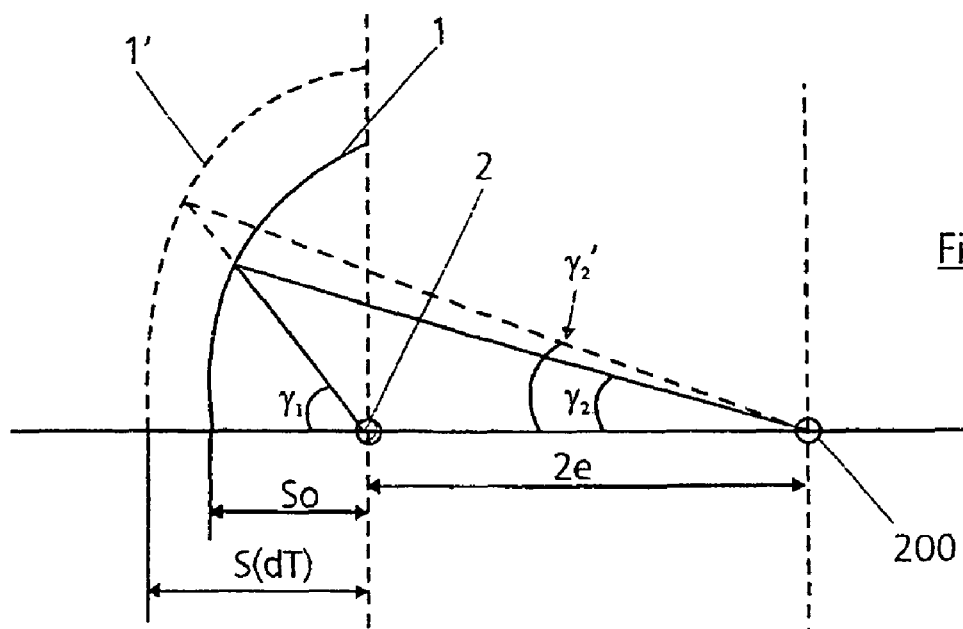
FIG. 2 shows a representation of the principle of the travel path of the radiation between the collector mirror and the second focus, for an isofocal family of ellipses.

FIG. 2 now shows a representation of the principle of a controlled change in shape and displacement of the collector mirror 1 such that the optical properties of the collector mirror are maintained. This illustrates a solution in which the collector mirror 1 is specifically displaced in the z-direction, and its shape is changed in accordance with an isofocal family of curves, in such a way that the second focus remains unchanged with reference to its position.

To a good approximation, the parameters $\epsilon$ and $p$ describing the family of ellipses can be represented as a linear function of the temperature change $dT$. It therefore holds that:

$$p \approx s_0 \left[ (1 + \varepsilon_0) + \alpha \left( 1 + \varepsilon_0 - \frac{s_0 \varepsilon_0}{a_0} \right) dT \right]$$

It holds in this case that:
p=semiparameter
2e=focal point spacing
$s_0$=distance from the source to the vertex of the collector mirror
$a_0 = e + s_0$ and $S(dT=0) = s_0$ It holds for the intercept distance=distance from the source to the collector mirror that:
$s = a - e$
$\alpha$=coefficient of linear expansion of the material used, and
$\epsilon$=numerical eccentricity of the ellipse
$\gamma_2$=aperture angle of the radiation between the second focus and the collector mirror.

As may be seen from FIG. 2, the focal point spacing 2e is maintained, and it is only the angle $\gamma_2$ which changes into $\gamma_2'$ and $S_0$ changes into $S(dT)$.

Figure 3:
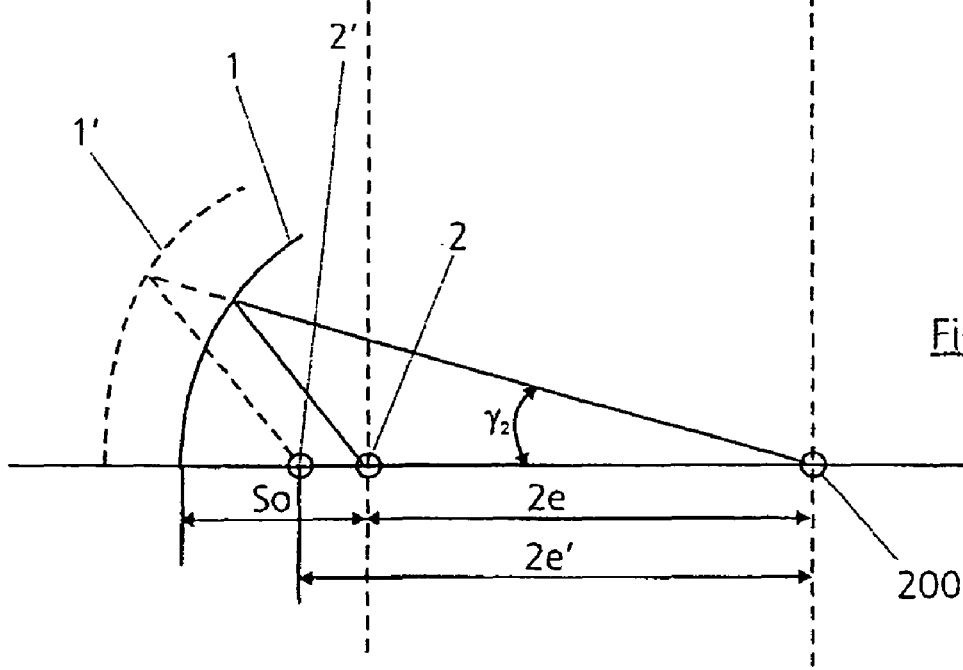
FIG. 3 shows a representation of the principle of the travel path of the radiation between the collector mirror and the second focus, for maintenance of the magnification.

FIG. 3 shows the representation of the principle of a solution, the collector mirror being designed in such a way that the magnification, that is to say the image scale or the aperture on the image side, does not change under thermal loading. The distance from the source 2 to the image of the light source must be varied for this purpose. The eccentricity $\epsilon$ or the conic constant $K$ must remain constant for this magnification-maintaining collector, and the vertex curvature $p=R$ must change linearly. It follows from this for the semiparameter $p$ that:

$$p = s \cdot (\epsilon + 1) = s_0 \cdot (1 + \alpha \cdot dT) \cdot (\epsilon + 1) = p_0 \cdot (1 + \alpha \cdot dT)$$

where aperture of the source $P_0$
aperture of the beam $$p_1 = \sin\gamma_2 = \frac{\sin\gamma_1}{\beta_c}$$

magnification of the collector $\beta_c$=const.

As may be seen from FIG. 3, in this case the focal point spacing 2e also changes into 2e', which means that the source 2 is displaced toward 2'. As may be seen, the aperture angle $\gamma_2$ is maintained in this case. Instead of a displacement of the source 2, it would also be possible in principle for the second focus to be displaced with the same result, in order to keep the angle $\gamma_2$ the same. In practice, however, the second focus will be kept fixed and the source 2 and collector mirror 1 will be displaced appropriately in the z-direction.

Of course, it is also possible to use families of hyperbolas or parabolas instead of families of ellipses.

The collector mirror 1 is designed in accordance with the set requirements such that it behaves when heated in a fashion which is isofocal or, alternatively, maintains the magnification. This means that a specific change in shape is permitted in such a way that its shape changes accordingly. The most varied design refinements are possible in order to achieve this shaping. The exemplary embodiments described below only schematically with the aid of FIGS. 4 to 9 are therefore to be regarded only by way of example. They relate to an isofocal collector mirror 1. It is true that, given an appropriate design configuration of the collector mirror 1, its suspension and, if appropriate, its cooling, there is likewise a change in the shape of the collector mirror 1, but this is done specifically in such a way that specific desired optical properties remain unchanged, however.

In accordance with the exemplary embodiment according to FIG. 4, the collector mirror 1 is connected at the circumference to a mount 10 via bearings 9 which can be displaced at right angles to the optical axis 8, that is to say to the z-axis (optical axis). Upon heating, the collector mirror 1 expands and the bearings 9 can be displaced—in accordance with the temperature—in the direction of the arrow 11 (see dashed illustration of the collector mirror 1). At the same time, the collector mirror 1 is moved rearward or away from the source 2 in a central guide 12 against the resistance of a spring device 13. As may be seen, this results in a change in spacing $\Delta a_1$ between the source 2 and the vertex. In order to maintain isofocality of the collector mirror, or to keep the latter isothermal with reference to its optical properties, it need only be ensured that the change in spacing $\Delta a_1$ is set in such a way as to result in the desired isofocal family of ellipses with the same optical effects resulting therefrom. The required change in spacing can, however, be determined either computationally or empirically from a knowledge of the materials used, the coefficients of expansion, the focal point spacings and further known parameters.

Under thermal loading, the collector mirror 1 should execute a displacement along the z-axis, that is to say the intercept distance must change. It is also advantageous for this purpose to mount the mirror in the plane 15 of the source 2. In the event of thermal expansion, it then automatically executes a movement against the z-axis 8. The ellipses then differ from one another only in the image scale of the source image or in the "relative aperture" of the aperture "on the image side". Such a change in the image scale is slight, however, and generally has only a negligible influence on the performance of the illuminating system.

If the passive design does not suffice, the z-displacement can be set more accurately by means of suitable materials in the mount or between the mount 10 and the collector mirror 1 or the bearing 9. This can be performed, for example, by means of a suspension via bending elements 16 (see FIG. 5), or else by means of one or more active components 17 (see FIG. 6). The active components 17 can be arranged between the collector mirror 1 and the mount 10. Use may be made as active components of, for example, materials with specific expansion coefficients, in order to achieve the required longitudinal displacement. Also possible likewise, are purely active actuating elements such as, for example, pneumatic, hydraulic, magnetostatic, piezoelectric elements and the like. Such active elements have the advantage that they can be driven specifically and, if required, also with appropriate adaptations and changes.

Figure 7:
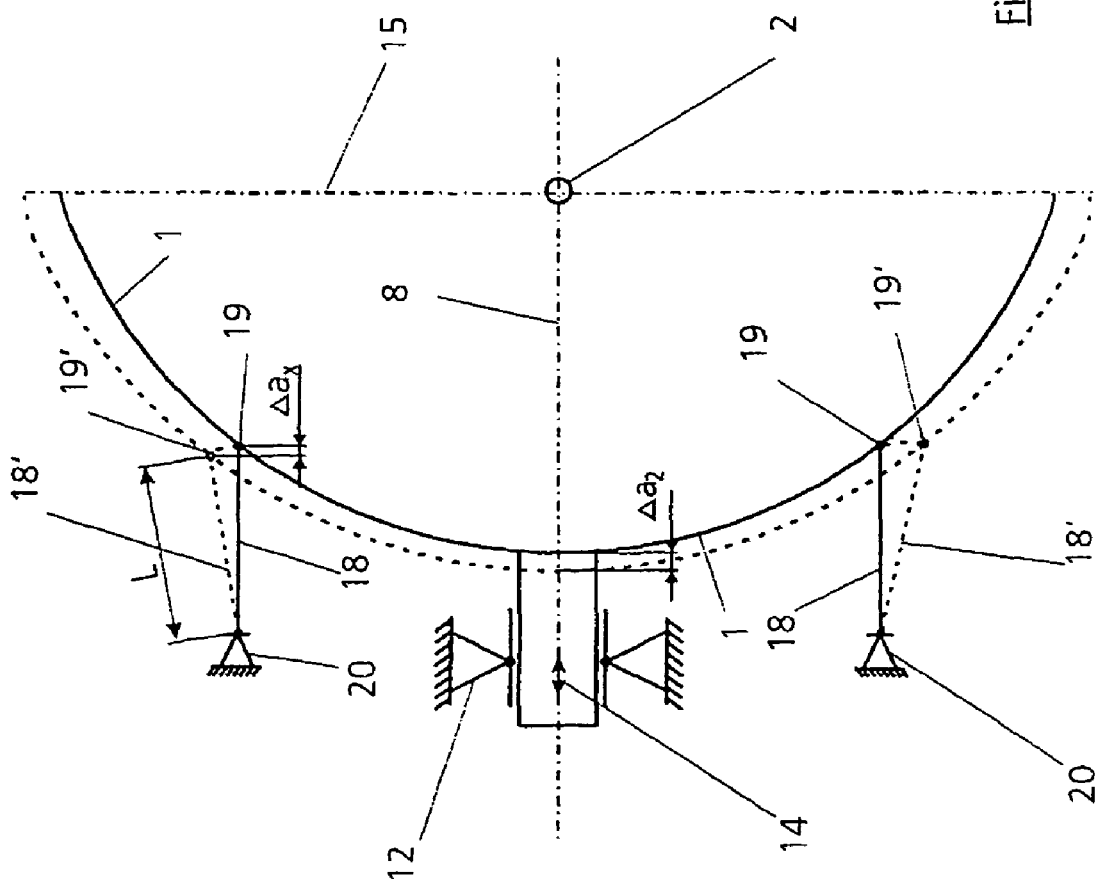
FIG. 7 shows a bearing of an isofocal collector mirror with an additional variation in spacing in the event of temperature increase.

A type of bearing for an isofocal collector mirror 1 is illustrated in FIG. 7, its "natural" displacement $\Delta a_1$ additionally further being amplified. For this purpose, a plurality of struts 18 are arranged from the collector mirror 1 in a fashion distributed over the circumference. They are located in this case in a circumferential region between the z-axis 8 and the outer circumference. The struts 18 are connected at one end to the collector mirror 1 via a fulcrum 19 in each case, while the other end is respectively supported in an articulated fashion at a bearing point 20 in each case. The longitudinal axes of the struts 18 extend parallel to the z-axis 8. If the collector mirror 1 now experiences a temperature rise, it expands and reaches the dashed position. At the same time, the struts 18 are also displaced thereby, and their fulcrums are displaced into the dashed positions 18' and 19', as a result of which the distance of the source 2 from the vertex of the collector mirror 1 additionally changes further by the value $\Delta a_x$. The total displacement of the collector mirror 1 is therefore $\Delta a_2 = \Delta a_1 + \Delta a_x$. $\Delta a_z$ can be set as desired via the lengths L of the struts 18 so as to achieve the isofocality.

The outward pivoting of the struts 18 produces a corresponding shortening with reference to the projection onto the z-axis, and thus additional path $\Delta a_x$.

The principle of a refinement is illustrated in FIG. 8, the inverse behavior being achieved. In this case, struts 18 likewise distributed over the circumference are provided, being situated between the z-axis 8 and the outer circumference of the collector mirror 1 and likewise being connected at one end to the collector mirror 1 via an articulation 19 in each case, and being mounted with the other end in a bearing point 20.

The longitudinal axes of the struts 18 are, however, arranged in this case obliquely relative to the z-axis in such a way that given a rearward displacement of the collector mirror 1 the struts 18 counteract this displacement, specifically by a measure $\Delta a_x$, in turn. In this case, it holds that $\Delta a_3 = \Delta a_1 - \Delta a_x$ for the displacement of the collector mirror 1. Here, as well, $\Delta a_x$ can be set via the lengths L of the struts 18, and it is possible thereby to achieve a corresponding total displacement of the collector mirror 1 in such a way as to produce isofocality.

Whether to select the refinement according to FIG. 7 with the increase in the total displacement distance, or in accordance with FIG. 8 with the reduction in the total displacement distance, is determined in each case by the specific conditions of use and parameters.

A type of bearing for the collector mirror 1 is illustrated in principle in FIG. 9, the bearing being performed with the aid of the mount 10 via a parallelogram 21.

If required, it is also possible further to provide various transformation ratios in order to achieve the desired isofocality of 8 the collector mirror 1.

If appropriate, it is also additionally possible to make further provision of a cooling device, which is indicated only in principle in FIG. 4 with the aid of the reference numeral "22". Since, in particular when used with laser plasma sources, collector mirrors 1 are heated nonuniformally in a fashion distributed over the circumference, the cooling ducts 22 are to be arranged such that local cooling can be carried out in such a way that, when seen overall, an at least largely uniform temperature results for the collector mirror 1.

In the event of temperature increase, displacement of the collector mirror 1 also produces a variation in the magnification factor—although only to a slight extent.

Figure 10:
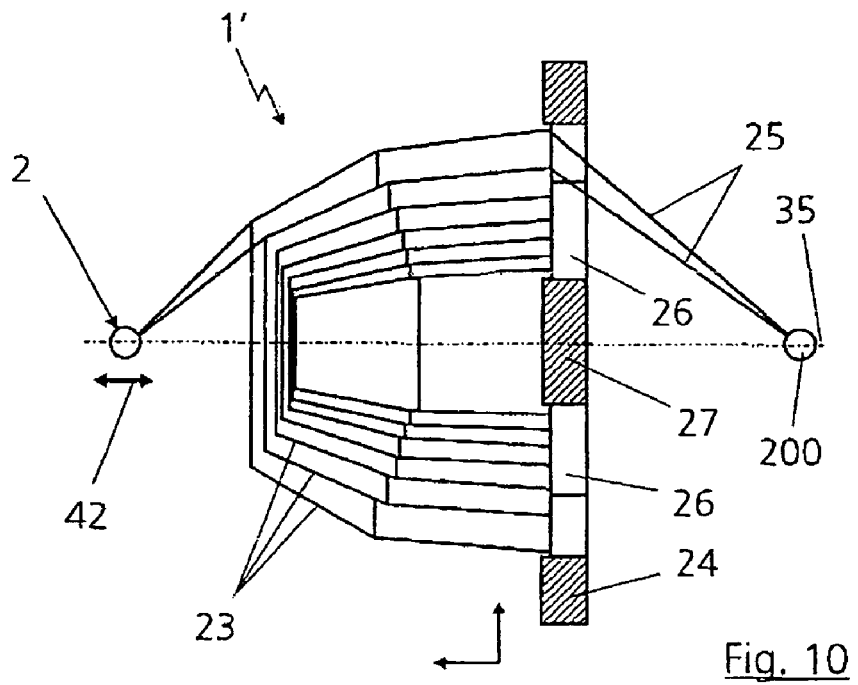
FIG. 10 shows a collector mirror in a second embodiment in the form of a shell connector with a multiplicity of annular shells, in a side view of the principle.
Figure 11:
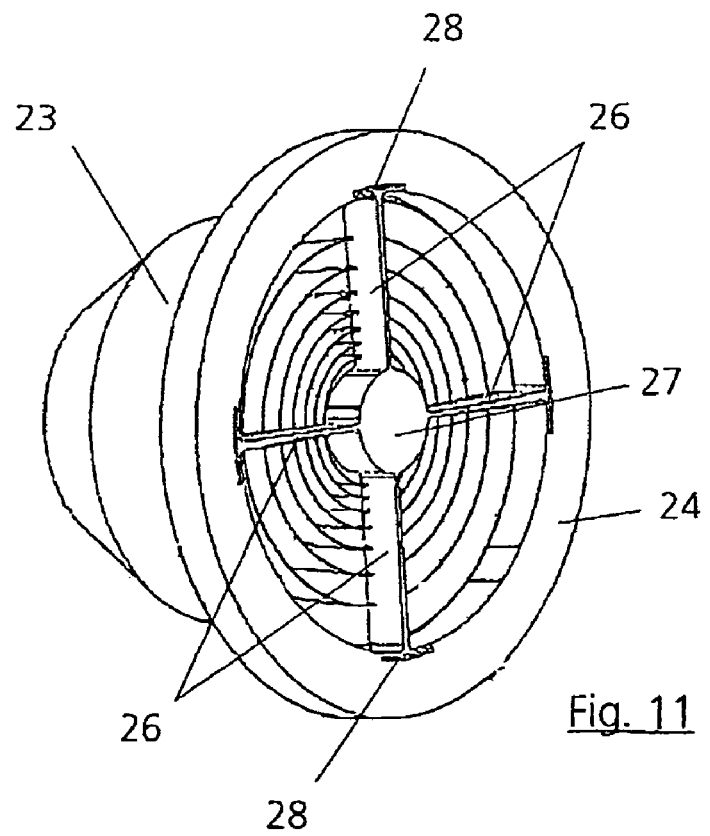
FIG. 11 shows the shell collector according to FIG. 10, in a perspective view.

FIGS. 10 and 11 show a collector mirror designed as a transmitted-light collector 1' which has a multiplicity of nested mirror annular shells 23, termed annular shells below, which are connected on one side or in a floating fashion via a bearing, explained in yet more detail below of a flange ring 24 on the side averted from the light source 2. In a departure from the exemplary embodiment according to FIG. 1, in the case of the transmitted-light collector 1' the light source 2 is located on the other side of the mirror 1, that is to say upstream in the beam direction (see also FIG. 10). There is provision in the exemplary embodiment illustrated of, for example, seven annular shells 23 via which the beams 25 generated by the light source 2 are passed on to a second focus. For reasons of clarity, only two beams 25 are illustrated here. A transmitted-light collector 1' having only one annular shell 23 is also possible in principle.

Instead of the annular shells 23 being supported on one side or in a floating fashion in the flange ring 24 on the side averted from the light source 2, the annular shells 23 can also be connected to the flange ring 24 in the region between the two ends. In this case, axial displacements are possible at both ends of the annular shells 23 in the event of temperature deviations. Of course, it is also possible for the annular shells 23 to be supported in the flange ring 24 on the side facing the light source 2.

It may be seen from FIG. 11 and from the enlarged illustration in FIG. 12 that the flange ring 24 has four radially running strengthening ribs 26 in which the annular shells 23 are clamped or supported. As can further be seen from FIGS. 10 and 11, the central area of the collector mirror 1' is occluded by a cover plate 27. Instead of four strengthening ribs 26, it is also possible, if appropriate, to provide only one rib or else a plurality of strengthening ribs.

As can be seen in FIG. 12, the flange ring 24 has cutouts in the form of slots 28 running in the circumferential direction in the region of the joining points of the strengthening ribs 26. The slots 28 extend by a multiple of the rib thickness in a circumferential direction, it being possible for the length of these slots 28 to be eight to ten times the thickness of a strengthening rib, for example. The longitudinal slots 28 serve only to decouple the strengthening ribs 26 from thermal stresses when different thermal expansions occur because of heating. The longitudinal slots 28 can give rise to linear expansions of the strengthening ribs 26, since owing to the slots 28 only a small thickness of material remains in the transition region to the mounting ring 24 in the region of the joining points, and so the elastic movements are possible.

The bearings 29 or bearing points in the form of bores or holders may be seen in FIG. 12. The precise configuration of the bearings 29 or holders, and of the annular shells 23 will be described in more detail in the following figures.

FIG. 13 shows the layout of a bearing, similar to the bearing according to FIG. 9, via a parallelogram 30 with two limbs 31, 32 which are arranged parallel to one another and are respectively connected at their ends via an articulation 33 to the mounting ring 24 or the ribs 26 and to a bearing part 34. An annular shell 23 is respectively held with its end in a bearing part 34 in any desired way, for example by welding, bonding or clamping. The respective other ends of the annular shells 23 are free, and so they can move freely in the event of temperature changes, in particular in the direction of the optical axis 35.

As is illustrated by dashes in FIG. 13, because of its articulated connection 33 the parallelogram 30 permits displacements of the annular shell 23 in the direction of the arrow 36 and thus perpendicular to the optical axis 35. At the same time, slight displacements in the direction of the optical axis are also additionally further possible in this case.

FIG. 14 shows a configuration of the parallelogram 30 with its two limbs 31 and 32 in a monolithic design with the bearing part 34 and the rib 26, which forms, in turn, one piece with the mounting ring 24. The articulations 33 are formed by reductions in thickness at the ends of the limbs 31 and 32. The parallelogram 30 according to FIG. 14 can be produced in a desired way, for example by milling, sawing or via erosion/cavity sinking.

FIG. 15 shows an exemplary embodiment with a bearing part 34 which is displaceable in the direction of the arrow 36 by means of a linear guide. Provided for this purpose is a guide 37 which is connecting to the bearing part 34 and is linearly displaceable in the direction of the arrow 36 in a bearing pin 38 with the aid of a linear guide. The bearing pin 38 is respectively supported in the associated strengthening rib 26.

FIGS. 16 to 18 show an embodiment of the bearing of the annular shells 23 in the strengthening ribs 26 via leaf springs 39. The leaf springs 39 are respectively shaped in this case from the annular shells 23 themselves in the region of the bearing points of the annular shells 23 at the strengthening ribs 26. One possibility for this is to introduce slots or cuts 40 which are arranged at a spacing from one another and form the leaf springs 39 between themselves. In the FIGS. 16 to 18, the cuts 40 are introduced parallel to the optical axis 35, as may be seen from the illustration in FIG. 17, viewed from the direction of the arrow in FIG. 16. Likewise on the basis of their elasticity, the leaf springs 39 permit displacements of the annular shells 23 perpendicular to the optical axis (arrow direction 36), and can be connected in any desired way to the strengthening ribs 26. This can be performed, for example, by bonding, welding or clamping.

FIGS. 19 and 20 show an embodiment similar to the type illustrated in FIGS. 16 to 18. The sole difference consists merely in that in this case the leaf springs 39 are not formed by cuts in the annular shells 23, but that separate leaf springs 39 are provided which are connected to the annular shells 23 in the region of the strengthening ribs 26 by means of bonding, soldering, welding or in any other desired way. Here, as well, the free ends of the leaf springs 39 can be connected to the strengthening ribs 26 by being clamped, bonded or welded into slots in the said ribs.

FIGS. 21 to 24 likewise show an embodiment with leaf springs 39 via which the annular shells 23 are connected to the strengthening ribs 26. Instead of leaf springs 39 arranged according to FIGS. 16 to 20 axially or parallel to the optical axis, these are arranged azimuthally or in a circumferential direction and thus perpendicular to the optical axis.

Figure 21:
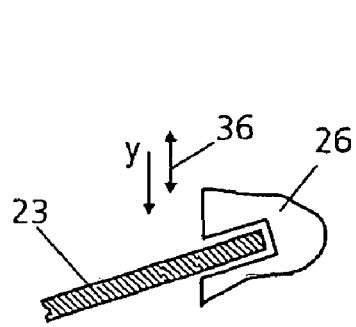
FIGS. 21 to 23 show a bearing of an annular shell in the mounting ring via a leaf spring, in a configuration similar to that illustrated in FIGS. 16 to 18, with a radially applied leaf spring.
Figure 22:
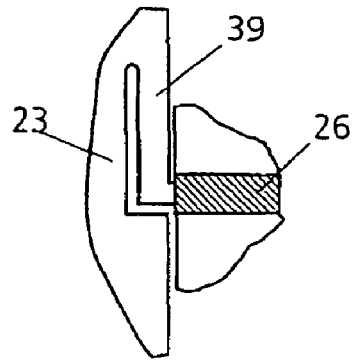
Figure 23:
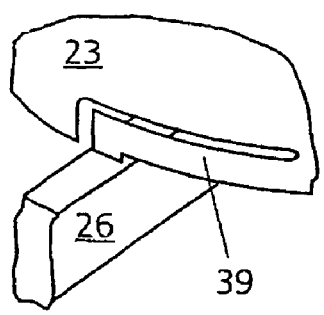

FIGS. 22 and 23 show the formation of the leaf springs 39 by means of an L-shaped incision in the annular shell 23. The shorter limb of the "L" runs in an axial direction, while the longer section of the "L" runs in a circumferential direction. FIG. 22 likewise illustrates a view from the arrow direction Y of FIG. 21, the arrow direction Y simultaneously also illustrating the arrow direction 36 and thus the direction of movement of the annular shell 23.

Figure 24:
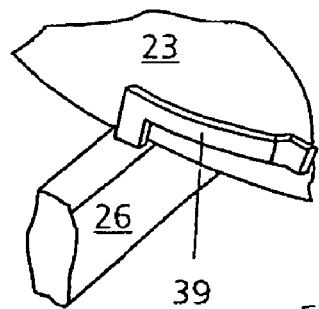
FIG. 24 shows the leaf spring illustrated in FIGS. 21 to 23, as a separate part attached to the annular shell.

FIG. 24 corresponds to the illustration in FIG. 23, although in this case the leaf spring 39 is not formed from the annular shell 23 but, as with the exemplary embodiment according to FIGS. 19 and 20, by a separate leaf spring 39 which is connected to an annular shell 23 by bonding, soldering, welding or else any other desired way.

In FIGS. 21 and 24, the free end of the leaf spring 39 is likewise connected respectively to the strengthening ribs 26 by bonding, soldering, welding or in any other desired way.

Figure 25:
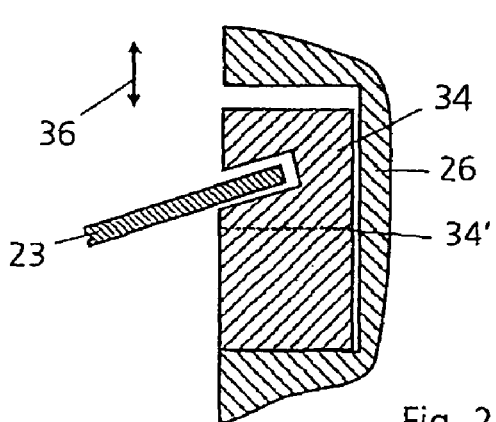
FIG. 25 shows a semi-active adjusting system for an annular shell by means of an actuator which changes with heat.
Figure 26:
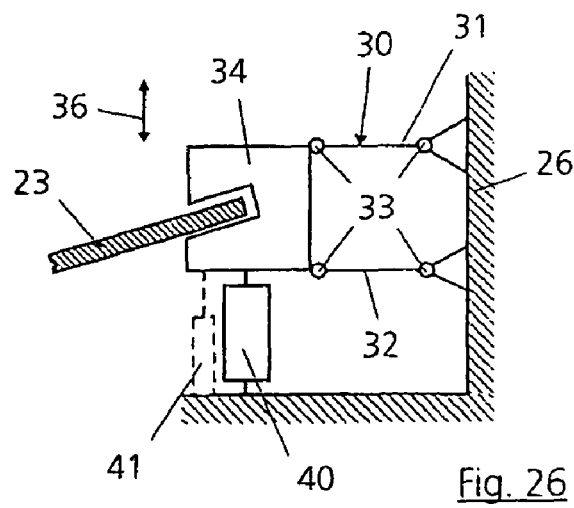
FIG. 26 shows an illustration of the principle of a bearing of an annular shell on the mounting ring, the displacement being performed by an active system.

Illustrated below in principle with the aid of FIGS. 25 and 26 are two possibilities as to how to use active concepts to implement the required possibility for displacing the annular shells 23 in a direction perpendicular to the optical axis. Active concepts have the advantage that the rigidity of the overall system is not negatively influenced by low rigidities such as are required by the passive concepts explained above. Rather, active concepts aim to bring the clamping points of the annular shells 23 in the strengthening ribs 26 to the positions at which they should be located in an ideal fashion at a specific temperature.

FIG. 25 illustrates one possibility, the bearing part 34 in which the annular shell 23 is held being designed with regard to material and/or coefficient of thermal expansion and fixing of the length L such that by an appropriate optimization the bearing shell 34 moves in the arrow direction 36 and thus perpendicular to the optical axis in such a way that the optical properties of the collector mirror 1' remain at least approximately the same in the event of temperature changes. In this case, the bearing part 34 is therefore connected permanently to the strengthening rib 26 on the inside.

Of course, it is not absolutely necessary for the bearing part 34 as a whole to be designed as a "thermal actuator" with the appropriate material, the coefficient of thermal expansion and the required length, but this can also be performed by a separate part 34' as active adjusting unit which is connected to the bearing part 34. This is illustrated by the dashed line in FIG. 25. In this case, the separate part 34' is connected to the strengthening rib 36. Instead of the thermal actuator illustrated in FIG. 25, other active adjusting units, which act on the bearing part 34 and adjust the latter in the direction of the arrow 36, are also possible.

It is also possible for the previously described passive systems additionally to be equipped with an active actuator, and this permits a combination of active and passive adjustment of the annular shells 23. A quasi-static and also a dynamic behavior can be influenced in a targeted fashion by an appropriate choice of the type and position of such actuators in conjunction with sensors and the corresponding design of a control loop. Thus, however, active damping can be created or else the rigidity is selected as a function of frequency. It can, for example, be selected to be low in the case of low frequencies (thermal drift), and high in the case of rapid, for example mechanical vibrations. Also conceivable is an arrangement of actuators in conjunction with corresponding sensors which always ensure an ideal circular shape of the annular shell 23 by forming the difference between the sensor values.

A combination between a passive element and an active adjusting unit is illustrated merely in terms of principle in FIG. 26. As may be seen, the passive element corresponds to the parallelogram 30 according to FIG. 13. In addition, an actuator 40 (not illustrated in more detail) further acts on the bearing part 34 as active adjusting unit which, in the event of temperature changes, ensures that the bearing piece 34 and thus the annular shell 23 held in it are moved in the arrow direction 36 into a position in which the annular shell 23 experiences the smallest deformations.

The most varied embodiments are possible for active adjusting units such as, for example, pulling wires, push rods, piezoelectric elements, electric, electromagnetic systems and similar units. Such active adjusting units can be used separately, or else in combination with passive elements. Only the longitudinally adjustable plunger 41 of telescopic design is indicated with the aid of dashes in FIG. 26. An actuation device (not illustrated) can be used to adjust the length of the plunger 41, displacements in the bearing part 34 in the arrow direction 36 occurring as a result.

Since the second focus would not always remain at the same point in each case in the event of changes in shape or displacements of the annular shells 23, it can be advantageous when, as indicated in FIG. 2 by the arrow 42, the light source 2 is appropriately displaced on the optical axis 35 in order to maintain the second focus. The displacement of the light source 2 in the arrow direction 42 can be performed by any desired devices (not illustrated here).

What is claimed is:

1. A focusing-device for the radiation from a light source, having a collector mirror which collects light from the light source located near its first focus with a first and a second focus lying on an optical axis at the second virtual or real focus, an is constructed and/or mounted in such a way that the position of the second focus remains unchanged in the event of temperature changes.

2. The focusing-device as claimed in claim 1, wherein the light source is a laser plasma source.

3. The focusing-device as claimed in claim 1, wherein the collector mirror can be displaced in direction of the optical axis and is constructed in such a way that in the event of temperature changes its shape can be changed in accordance with an isofocal family of curves in such a way that the spacing between the first focus and the second focus is kept constant.

4. The focusing-device as claimed in claim 1, wherein the collector mirror can be displaced in the z-direction of the optical axis and its shape can be varied in the event of temperature changes in such a way, and the light source can be displaced in such a way that at the angle distribution of the radiation remains the same at the second focus.

5. The focusing-device as claimed in claim 1, wherein the collector mirror can be displaced in the direction of the optical axis or its shape can be varied or the light source can be displaced in such a way that the angle distribution of the radiation remains the same at the second focus in case of temperature changes.

6. The focusing-device as claimed in claim 1, wherein the collector mirror is mounted to a frame in the plane of the light source.

7. The focusing device as claimed in claim 6, wherein the displacement can be carried out by passive change in shape of the collector mirror or the mount thereof.

8. The focusing-device as claimed in claim 6, wherein the displacement can be carried out by a passive change in shape of the collector mirror or the mount thereof.

9. The focusing-device as claimed in claim 6, wherein the collector mirror is mounted in the frame via a parallelogram beam arrangement.

10. The focusing-device as claimed in claim 6, wherein active components are provided for the displacement.

11. The focusing-device as claimed in claim 10, wherein the active components are arranged between the collector mirror and the frame.

12. The focusing-device as claimed in claim 6, wherein the collector mirror is connected to the mount via bending beams.

13. The focusing-device as claimed in claim 1, wherein the collector mirror is biased in the direction of the light source.

14. The focusing-device as claimed in claim 13, wherein a spring device is provided for the biasing.

15. The focusing-device a claimed in claim 1, wherein given an anisotropic thermal loading, the collector mirror is provided with inhomogeneously distributed cooling devices in such a way that an approximately uniform temperature distribution can be achieved in the collector mirror.

16. The focusing-device as claimed in claim 1, for the use in micro lithography using EUV-radiation.

17. The focusing-device as claimed in claim 1, wherein the collector mirror can be displaced in the direction of the optical axis.

18. The focusing-device as claimed in claim 1, which is held by a mount, wherein said collector mirror can be adjusted or displaced in said mount via a bearing in such a way that optical properties of the collector mirror remain at least approximately the same in the event of temperature changes.

19. The device as claimed in claim 18, wherein said bearing is designed in such a way that said collector mirror can be displaced at least perpendicular to the optical axis in the region of its bearing.

20. The device as claimed in claim 18, wherein said mount is designed as a mounting ring in which said collector mirror with its bearing is held.

21. The device as claimed in claim 20, wherein a plurality of bearings are arranged, distributed over the circumference, in strengthening ribs of said mounting ring.

22. The device as claimed in claim 20, wherein the bearings of the collector mirror are provided with elements which permit movements of said collector mirror perpendicular to an optical axis.

23. The device as claimed in claim 22, wherein said elements are designed as active adjusting units.

24. The device as claimed in claim 18, wherein said collector mirror is designed as a shell collector according to the transmitted-light system with one or more annular shells arranged at a radial distance from one another.

25. The device as claimed in claim 24, wherein said annular shells are held jointly in bearings on a mount designed as a mounting ring.

26. The device as claimed in claim 25, wherein said annular shells are held in each case on one side on said mounting ring, and can be displaced in each case in the direction of the optical axis at an end not connected to said mounting ring.

27. The device as claimed in claim 26, wherein said annular shells are held on said mounting ring on said side averted form the light source.

28. The device as claimed in claim 25, wherein between said two ends the annular shells are connected to said mounting ring in a fashion respectively moveable in a radial direction, the two ends of said annular shells being respectively displaceable in the direction of the optical axis.

29. The device as claimed in claim 25, wherein said annular shells are respectively supported by their bearings in radial strengthening ribs of said mounting ring.

30. The device as claimed in claim 25, wherein said bearings are situated parallel to the optical axis, the size of the bearings being selected in a direction perpendicular to the optical axis to be so large that said annular shells held in the bearings are displaceable in a direction perpendicular to the optical axis.

31. The device as claimed in claim 29, wherein one or more strengthening ribs are arranged distributed over the circumference are provided.

32. The device as claimed in claim 31, wherein four strengthening ribs are arranged distributed uniformly over the circumference.

33. The device according to claim 29, wherein said mounting ring is provided with cutouts in the region where the strengthening ribs are joined to the mounting ring.

34. The device as claimed in claim 33, wherein said cutouts are designed as slots which run in the circumferential direction of the mounting ring.

35. The device as claimed in claim 34, wherein the length of said slots corresponds to the multiple of the rib thickness of said strengthening ribs.

36. The device as claimed in claim 25, wherein said annular shells are respectively held at their ends projecting into said bearings in a bearing part which is displaceable perpendicular to the optical axis.

37. The device as claimed in claim 36, wherein said bearing part is provided with elements which permit movements of the annular shells perpendicular to the optical axis.

38. The device as claimed in claim 37, wherein a parallelogram is provided as said element, one end of the parallelogram being connected to said bearing part, and the other end of said parallelogram being connected to said mounting ring in the region of said strengthening ribs.

39. The device as claimed in claim 38, wherein said bearing part and said parallelogram are of monolithic design.

40. The device as claimed in claim 39, wherein said bearing part, the parallelogram and the mounting ring having said strengthening ribs are monolithic design.

41. The device as clamed in claim 37, wherein said element has a linear guide with a guide which is connected to said bearing part, said guide being linearly displaceable in a bearing pin or a linear guide which is supported in said mounting ring.

42. The device as claimed in claim 37, wherein by means of cuts introduced into said annular shells the annular shells respectively form at connecting points with said mounting ring leaf springs via which the annular shells are connected to the mounting ring.

43. The device as claimed in claim 42, wherein two cuts which are arranged at a spacing from one another in a fashion running parallel to the optical axis and between which said leaf springs are formed are provided in said annular shells.

44. The device as claimed in claim 42, wherein provided for each bearing for the purpose of forming a leaf spring is a cut parallel to the optical axis and a cut running in the circumferential direction.

45. The device as claimed in claim 37, wherein provided for the purpose of connecting said annular shells to said mounting ring are leaf springs which are fitted on the circumference of said annular shells an are respectively connected at one end to the annular shells an are respectively connected at the other end to said mounting ring.

46. The device as claimed in claim 25, wherein said bearings are provided with active adjusting units.

47. The device as claimed in claim 46, wherein said active adjusting units comprise piezoelectric elements.

48. The device as claimed in claim 46, wherein said active adjusting units comprises electric or electromagnetic adjusting units.

49. The device as claimed in claim 46, wherein said active adjusting units comprises hydraulic or pneumatic units.

50. The device as claimed in claim 46, wherein said active adjusting units have plunges which are designed to be variable in length.

51. The device as claimed in claim 50, wherein said plungers are of telescopic design.

52. The device as claimed in claim 37, wherein said bearing part is designed as a thermal actuator, or is provided with a thermal actuator, the thermal actuator being pre-selected with reference to material and coefficient of thermal expansion in conjunction with its length in such a way that said annular shells execute displacements perpendicular to the optical axis in the event of temperature changes.

53. The device as claimed in claim 52, wherein said thermal actuator is designed as a separate part which acts on the bearing part.

54. The device as claimed in claim 18, wherein a plasma source is provided as light source.

55. Projection exposure machine with an illuminating system in semiconductor lithography, having a light source and a collector mirror which is held by a mount and which collects the light form the light source at its focus, in virtual or real terms, wherein said collector mirror can be adjusted or displaced in said mount via a bearing in such a way that optical properties of the collector mirror remain at least approximately the same in the event of temperature changes.

56. The projection exposure machine as claimed in claim 55, wherein said light source is designed as a plasma source for EUV radiation.

57. The projection exposure machine as claimed in claim 55, wherein said collector mirror is designed as a shell collector according to the transmitted-light system with a plurality of annular shells arranged at a radial distance from one another.

58. The projection exposure machine as claimed in claim 57, wherein said annular shells are respectively supported in bearings in the mount designed as a mounting ring.

59. The projection exposure machine as claimed in claim 58, wherein said annular shells are held in each case on one side on said mounting ring and can be displaced in each case at an end averted from said mounting ring in the direction of the optical axis.

60. The projection exposure machine as claimed in claim 58, wherein said annular shells are respectively supported by their bearings in radial strengthening ribs of said mounting ring.

61. The projection exposure machine as claimed in claim 58, wherein said bearings are situated parallel to the optical axis, the size of the bearings being selected in a direction perpendicular to the optical axis to be so large that said annular shells held in the bearings are displaceable in a direction perpendicular to the optical axis.

62. The projection exposure machine as claimed in claim 60, wherein one or more strengthening ribs arranged distributed over the circumference are provided.

63. The projection exposure machine as claimed in claim 60, wherein said mounting ring is provided with cutouts in the region where the strengthening ribs are joined to said mounting ring.

64. The projection exposure machine as claimed in claim 63, wherein said cutouts are designed as slots which run in the circumferential direction of said mounting ring.

65. The projection exposure machine as claimed in claim 58, wherein said annular shells are respectively held at their ends projecting into said bearings in a bearing part which is displaceable perpendicular to the optical axis.

66. The projection exposure machine as claimed in claim 65, wherein said bearing part is provided with elements which permit movements of said annular shells perpendicular to the optical axis.

67. The projection exposure machine as claimed in claim 58, wherein said bearings are provided with active adjusting units.

* * * * *

UNITED STATES PATENT AND TRADEMARK OFFICE
CERTIFICATE OF CORRECTION

| | |
|---|---|
| PATENT NO. | : 7,871,171 B2 |
| APPLICATION NO. | : 12/218400 |
| DATED | : January 18, 2011 |
| INVENTOR(S) | : Martin Antoni |

It is certified that error appears in the above-identified patent and that said Letters Patent is hereby corrected as shown below:

Title page, item (75), to set forth the following:

(75) Inventors: Martin Antoni Aalen (DE); Frank Melzer Utzmemmingen (DE); Andreas Seifert Aalen (DE); Wolfgang Singer Aalen (DE); Wilhelm Egle Aalen (DE); Bernhard Gellrich Aalen (DE); Bernhard Geuppert Aalen (DE)

Title page, Col. 2 (other publications), line 3, Delete "Berhard," and insert --Bernhard,--

Title page, Col. 2 (other publications), lines 5 & 6, Delete "Calrl" and insert --Carl--

Title page, Col. 2 (Abstract), line 5, Delete "displaceably" and insert --displaceable--

Column 2,
Line 33, Delete "inhomogenously" and insert --inhomogeneously--

Column 3,
Line 44, Delete "possiblility" and insert --possibility--

Column 3,
Line 49, Delete "held are" and insert --held,--

Column 9,
Line 36, After "In" Delete "the"

Column 11,
Claim 1, Line 20, Delete "focus, an is constructed" insert --focus, and is constructed--

Signed and Sealed this
Eleventh Day of October, 2011

David J. Kappos
*Director of the United States Patent and Trademark Office*

Column 13,
Claim 45, Line 47-49, Delete "said annular shells an are respectively connected at one end to the annular shells an are respectively connected" insert --said annular shells and are respectively connected at one end to the annular shells and are respectively connected at the other end to said mounting ring.--